US008673541B2

(12) United States Patent
Xiao et al.

(10) Patent No.: US 8,673,541 B2
(45) Date of Patent: *Mar. 18, 2014

(54) BLOCK COPOLYMER ASSEMBLY METHODS AND PATTERNS FORMED THEREBY

(75) Inventors: Shuaigang Xiao, Fremont, CA (US); XiaoMin Yang, Livermore, CA (US); Yuan Xu, Fremont, CA (US); Lei Wan, Madison, WI (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/916,279

(22) Filed: Oct. 29, 2010

(65) Prior Publication Data

US 2012/0107583 A1  May 3, 2012

(51) Int. Cl.
*G03F 7/20* (2006.01)

(52) U.S. Cl.
USPC .......................... 430/296; 430/320; 430/323

(58) Field of Classification Search
None
See application file for complete search history.

(56) References Cited

U.S. PATENT DOCUMENTS

| | | | |
|---|---|---|---|
| 6,822,833 B2 | 11/2004 | Yang et al. | |
| 7,029,773 B2 | 4/2006 | van de Veerdonk et al. | |
| 7,041,394 B2 | 5/2006 | Weller et al. | |
| 7,344,773 B2 | 3/2008 | Subramanya et al. | |
| 7,351,445 B2 | 4/2008 | Haginoya et al. | |
| 7,416,991 B2 | 8/2008 | Bandic et al. | |
| 7,622,367 B1 | 11/2009 | Nuzzo et al. | |
| 7,790,350 B2 | 9/2010 | Breyta et al. | |
| 7,964,107 B2 | 6/2011 | Millward | |
| 2002/0132083 A1 | 9/2002 | Weller et al. | |
| 2003/0091752 A1 | 5/2003 | Nealey et al. | |
| 2003/0091865 A1 | 5/2003 | Chen et al. | |
| 2003/0194582 A1 | 10/2003 | Ishikawa et al. | |
| 2004/0071924 A1 | 4/2004 | Yang et al. | |
| 2006/0222898 A1 | 10/2006 | Ichihara | |
| 2008/0176749 A1 | 7/2008 | Goyal | |
| 2008/0299353 A1 | 12/2008 | Stoykovich et al. | |
| 2009/0087664 A1 | 4/2009 | Nealey et al. | |
| 2009/0196488 A1* | 8/2009 | Nealey et al. | 382/145 |
| 2009/0260750 A1 | 10/2009 | Nealey et al. | |
| 2009/0308837 A1* | 12/2009 | Albrecht et al. | 216/22 |
| 2010/0124629 A1 | 5/2010 | Gopalan et al. | |
| 2010/0124638 A1* | 5/2010 | Xiao et al. | 428/195.1 |
| 2010/0165512 A1* | 7/2010 | Albrecht et al. | 360/244 |
| 2010/0178615 A1* | 7/2010 | Colburn et al. | 430/323 |

FOREIGN PATENT DOCUMENTS

| | | |
|---|---|---|
| WO | WO 04001756 | 12/2003 |
| WO | WO 2006118677 | 11/2006 |

OTHER PUBLICATIONS

English language abstract of JP 2008-016071 (Jan. 2008).*
English language abstract of JP 2009-193636 (Aug. 2009).*
English language abstract of JP 2010-123239 (Jun. 2010).*
English language abstract of JP 2007-272962 (Oct. 2007).*
English language abstract of JP 2011-523376 (Aug. 2011).*
English language abstract of JP 2007-301839 (Nov. 2007).*

(Continued)

*Primary Examiner* — John A. McPherson

(57) ABSTRACT

Patterned substrates templates are provided, as well as methods comprising a combination of lithography and self-assembly techniques. The patterned substrates may comprise first and second patterns.

12 Claims, 10 Drawing Sheets

(56) References Cited

OTHER PUBLICATIONS

Miller et al., "Step and Flash Imprint Process Integration Techniques for Photonic Crystal Patterning: Template Replication through Wafer Patterning Irrespective of Tone", *Advanced Fabrication Technologies for Micro/Nano Optics and Photonics*, Proceedings vol. 6883.

Park et al., Block Copolymer Lithography: Period Arrays of ~10A11 Holes in 1 Square Centimeter, Science, 1997. 276, 1401.

M. Park et al., "Large Area Dense Nanoscale Patterning of Arbitrary Surfaces", Applied Physics Letters, vol. 79, No. 2, Jul. 9, 2001, pp. 257-259.

K. Asakawa et al., "Nano-Patterning for Patterned Media Using Block-Copolymer", Journal of Photopolymer Science and Technology, vol. 15, No. 3, 2002, pp. 465-470.

J. Liang et al., "Nonlithographic Fabrication of Lateral Superlattices for Nanometric Electromagnetic-Optic Applications" IEEE Journal of Selected Topics in Quantum Electronics, vol. 8, No. 5, Sep./Oct. 2002, pp. 998-1008.

J. Y. Cheng et al., "Templated Self-Assembly of Block Copolymers: Effect of Substrate Topography", Advanced Materials, vol. 15, No. 19, Oct. 2, 2003, pp. 1599-1602.

D. Sundrani et al., "Guiding Polymers to Perfection: Macroscopic Alignment of Nanoscale Domains", NANO Letters, vol. 4, No. 2, 2004, pp. 273-276.

M. Li et al., "Block Copolymer Patterns and Templates", Materials Today, vol. 9, No. 9, Sep. 2006, pp. 30-39.

From U.S. Appl. No. 12/273,791:—Office Actions dated Apr. 26, 2012, Sep. 14, 2011.

From U.S. Appl. No. 12/273,791:—Office Action dated Apr. 15, 2013.

* cited by examiner

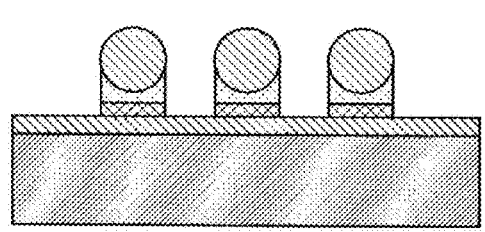
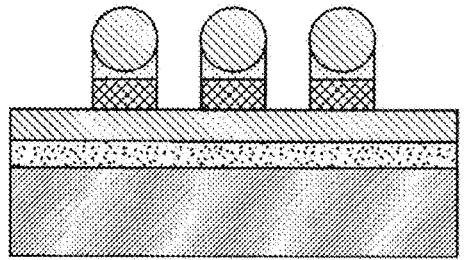
RIE INTO HARD MASK LAYER          RIE INTO HARD MASK LAYER
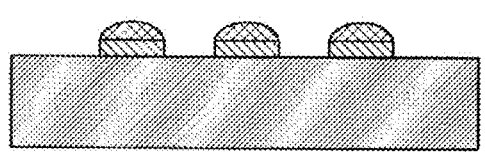
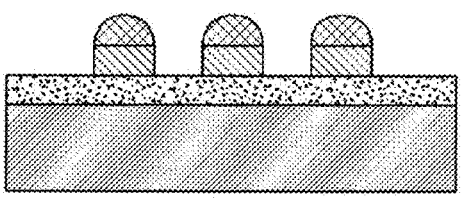
RIE INTO MOLD MATERIAL          IBE OR RIE INTO MAGNETIC MATERIAL
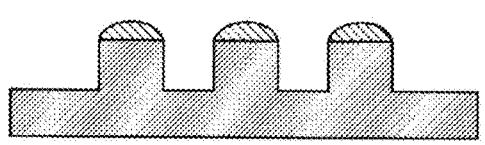
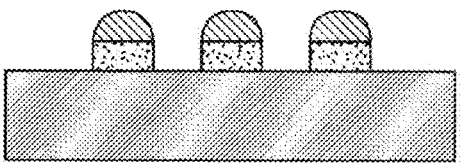
FIG. 7(a)          FIG. 7(b)

BLOCK COPOLYMER ASSEMBLY METHODS AND PATTERNS FORMED THEREBY

FIELD

Templates may be patterned using block copolymer self-assembly techniques.

BACKGROUND

In fabricating media for hard disk drives ("HDD"), bit patterned media ("BPM") may be used in the storage industry because of their high storage capacity. The storage capacity of BPM depends on the density of the magnetic islands, or "bits" on the media substrate surface. As such, research in the area of BPM fabrication has mainly been devoted to creating consistent and uniform patterns of bits on a BPM substrate. However, HDD media have different regions besides the regions used for storing data (i.e., "data zones"). For example, in addition to data zones, a typical HDD will have "servo zones" used to describe the data in the data zones. The servo zones contain information such as head position, timing, and track-following information for the respective data zones. A typical HDD may have numerous data zones, and numerous servo zones corresponding to those data zones.

SUMMARY

A method including conducting lithography to form a first pattern on a substrate, and conducting block-copolymer self-assembly to form a second pattern on the substrate.

BRIEF DESCRIPTION OF THE DRAWINGS

Various aspects of the present invention are illustrated by way of example, and not by way of limitation, in the accompanying drawings, wherein:

FIGS. 7(a) and (b) are flow diagrams illustrating pattern transfer schemes for (a) fabrication of an imprint mold using low aspect ratio block copolymer domain structures and (b) fabrication of magnetic dots using high aspect ratio block copolymer domain structures according to an embodiment.

DETAILED DESCRIPTION

Figure 1:
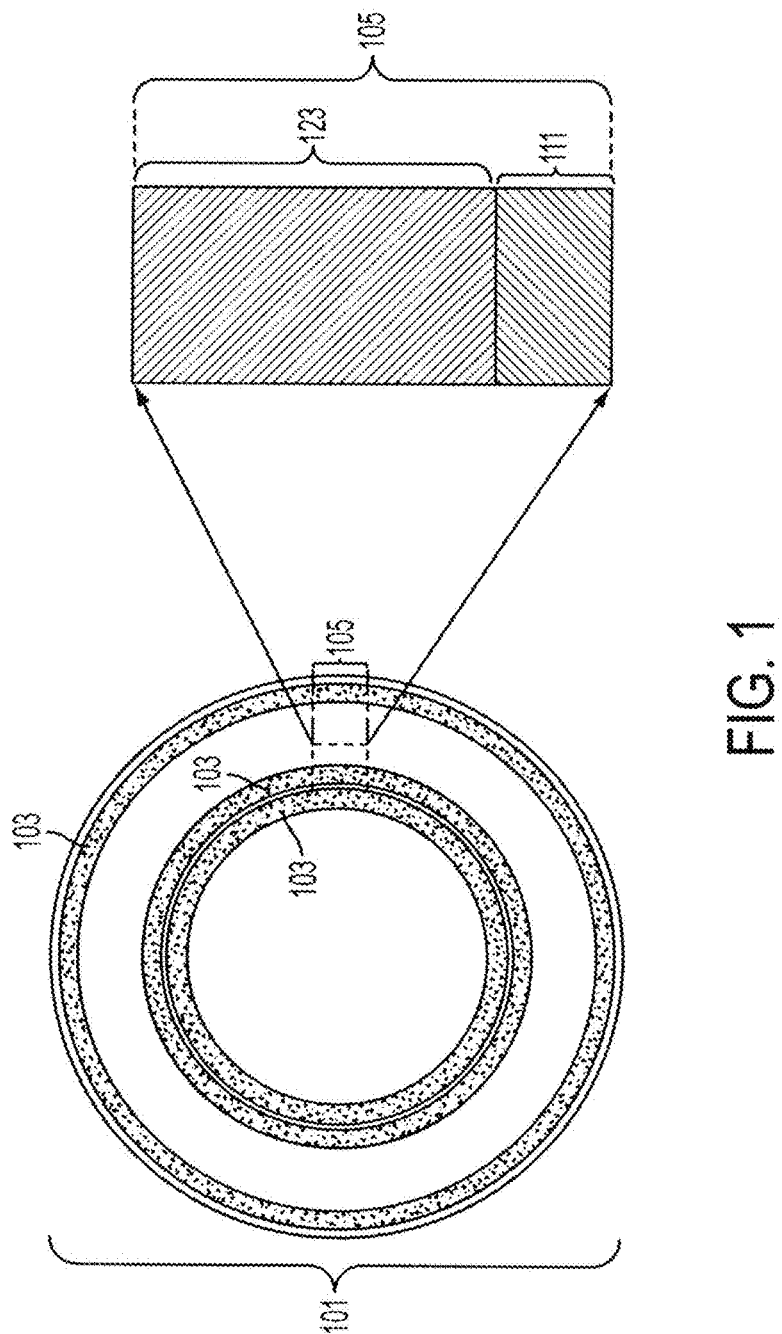
FIG. 1 is a diagram depicting a BPM template according to an embodiment.
Figure 2A:
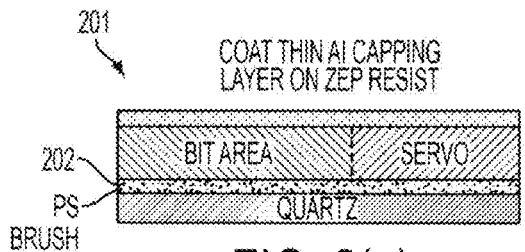
FIG. 2 is a flow diagram illustrating a method for patterning a substrate according to an embodiment.
Figure 2F:
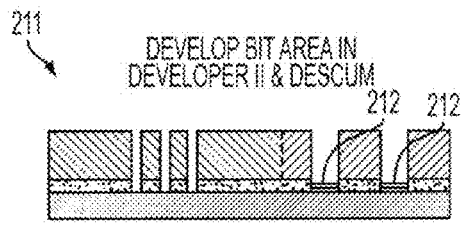
Figure 2B:
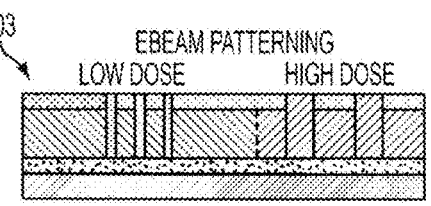
Figure 2G:
Figure 2C:
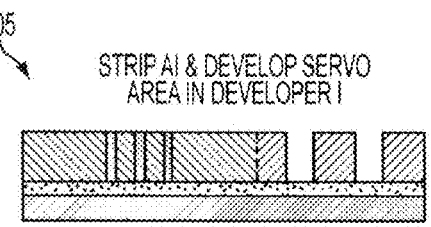
Figure 2H:
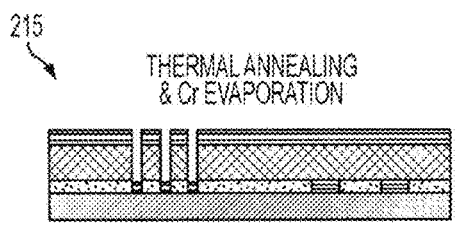
Figure 2D:
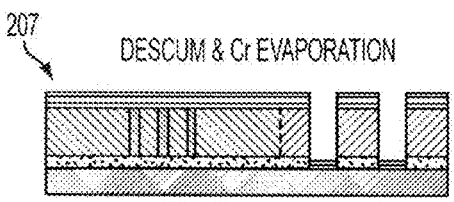
Figure 2I:
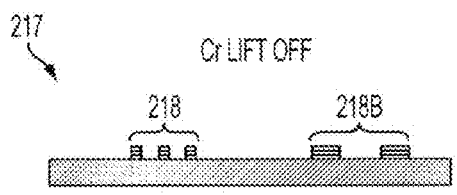
Figure 2E:
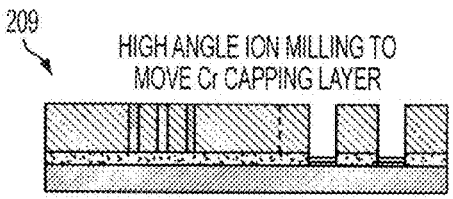
Figure 2J:
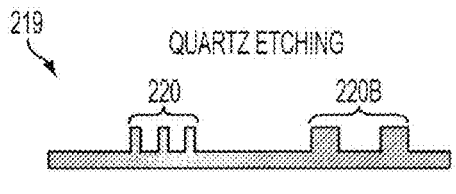
Figure 3F:
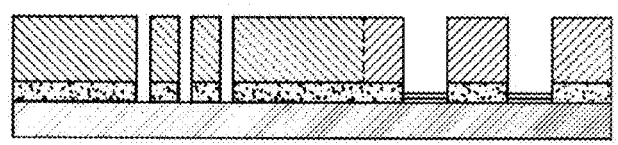
FIG. 3 is a flow diagram illustrating another method for patterning a substrate according to an embodiment.
Figure 3G:
Figure 3H:
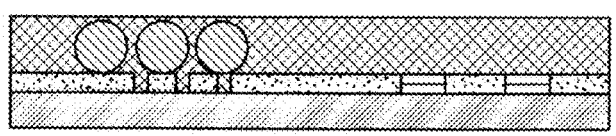
Figure 3I:
Figure 3J:

The present disclosure is described more fully hereinafter with reference to the accompanying drawings, in which various aspects of embodiments are shown. This, however, may be embodied in many different forms and should not be construed as limited to the various aspects of embodiments presented throughout this disclosure. Rather, these aspects are provided so that this disclosure will be thorough and complete, and will fully convey the scope of embodiments to those skilled in the art. The various aspects of the illustrated in the drawings may not be drawn to scale. Rather, the dimensions of the various features may be expanded or reduced for clarity. In addition, some of the drawings may be simplified for clarity.

Various aspects of embodiments will be described herein with reference to drawings that are conceptual illustrations of idealized configurations. As such, variations from the conceptual illustrations are to be expected in practice. By way of example, various elements such regions, layers, sections, or the like of a storage medium may be illustrated or described as a rectangle may have rounded or curved features and/or a gradient concentration at its edges rather than a discrete change from one element to another. Thus, the elements illustrated in the drawings are conceptual in nature and not intended to limit the scope of aspects of this invention.

It will be understood that when an element such as a region, layer, section, or the like, is referred to as being "on" another element, it may be directly on the other element or intervening elements may also be present. It will be further understood that when an element is referred to as being "formed" on another element, it may be grown, deposited, etched, attached, connected, coupled, or otherwise prepared or fabricated on the other element or an intervening element.

Furthermore, an element such as a region, layer, section, or the like, may be illustrated as being above or below another element to describe one element's relationship to another element. It will be understood that relative terms are intended to encompass different orientations of an apparatus in addition to the orientation depicted in the drawings. By way of example, if an apparatus depicted in a drawing is turned over, elements described as being above are now below, and vice versa.

As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

In embodiment described, templates are provided, as well as methods using a combination of lithography and self-assembly techniques. Servo zones of Bit-Patterned Media (BPM) templates may be patterned using e-beam lithography, and bit zones of BPM templates may be patterned using block copolymer self-assembly techniques. Systems and methods for integrating electron beam lithography patterning techniques with block copolymers are provided in order to create nanopatterns, which may have a bit density greater than 1 Tdpsi. By exposing a substrate to differently dosed electron beams, and developing each exposed region using different developers, a substrate may be patterned with different density patterns nearly simultaneously, without leaving alignment marks on the template substrate surface.

1. Templates

FIG. 1 is an illustration of a BPM template structure according to an embodiment. The substrate used to prepare the BPM template may be quartz or silicon, or any other suitable substrate material. The determination of which substrate material to use depends upon the end use of the substrate. One having ordinary skill in the art will be able to make this determination using known information such as the longevity specification for the template, and the pattern density.

As shown, BPM template 101 may comprise a plurality of tracks 103. Each track 103 may in turn be divided into a plurality of sectors 105. A sector 105 may incorporate two types of regions, or zones, such as a servo zone 111 and a data or bit zone 123. As shown in FIG. 1, these regions may be organized in an alternating formation along a track, such as: servo zone, bit zone, servo zone, bit zone, etc. A servo zone 111 may be immediately adjacent to its respective bit zone 123. The BPM template may have tens or hundreds of sectors per track. For example, there may be 360 sectors in a track, such that there are 360 servo zones and 360 data zones. As such, the sectors may be smaller in length in the tracks closer to the center of a template when compared to the sectors farther from the center of a template. However, the number of sectors may differ depending upon the design of the template and the media that may be produced using the template.

A person having ordinary skill in the art will appreciate that the servo zone 111 may be used to store information describing the data stored in bit zone 123. The pattern for servo zone 111 may differ from the pattern of bit zone 123. Since the servo zone 111 typically contains less information than the bit zone 123, servo zone 111 may have lower bit density than bit zone 123. For example, the bit zone 123 may have a bit density of from about 500 Gdpsi to about 18.0 Tdpsi, from about 720 Gdpsi to about 10 Tdpsi, or from about 1 Tdpsi to about 5 Tdpsi. The zones may be provided adjacent to one another, or there may be a space separating the zones. The space may have no pattern, or a pattern different from the bit and servo zone patterns.

It will be understood that although two different patterns are provided on a substrate, the patterned substrates and BPM templates are not limited to having two patterns provided thereon. Any number of patterns may be provided.

When a BPM template is prepared, the template may include servo zones and data zones. The servo zones may be prepared using lithography techniques, such as e-beam lithography, and the data zones may be prepared using a combination of lithography and self-assembly techniques, such as block copolymer self-assembly. The BPM templates may not include any alignment marks to indicate the locations of the data zones and servo zones.

2. Fabrication Methods

Methods are provided for integrating lithography with self-assembly in order to efficiently create at least two areas on a template substrate that have different patterns. The dual-patterned template substrate may then be used as a master template for direct fabrication of other patterned media, including daughter templates and BPM.

Methods incorporating self-assembly, such as block copolymer self-assembly, are capable of providing high resolution and acceptable throughput levels. This is because lithography techniques, such as e-beam lithography, typically use lower throughput in order to achieve large areas of dense patterning at acceptable resolutions. However, in order to meet the demands of BPM manufacturing, additional aspects may have to be addressed beyond pattern resolution.

Block copolymer domains may lack long-range order, which means that there may be many grain boundaries within a small area. These grain boundary defects cause deterioration in domain size uniformity and domain position accuracy. Pattern resolution of <25 nm domain spacings (i.e., >1 Tdot/$in^2$), domain size and position uniformity of less than 6% (1 sigma), high dry etching resistance, and high aspect ratio structures facilitate pattern transfer. These issues are also addressed by the methods.

The methods described herein may be used to form a patterned substrate conducting lithography to form a first pattern on a substrate and conducting block-copolymer self-assembly to form a second pattern on said substrate.

The methods may be performed by lithography techniques in which a mask layer is deposited on the substrate; and a first pattern is formed on the substrate. Some methods further provide a chemical affinity layer on the substrate before conducting block-copolymer self-assembly techniques. The block-copolymer self-assembly may comprise coating the substrate with a block copolymer, removing one block from the block copolymer, and transferring the pattern from the remaining block of the block copolymer to the substrate.

The methods may be used to form a first pattern on a portion of the surface of the substrate, and a second pattern on a portion of the surface of the substrate adjacent to said first pattern. The first and second patterns may be adjacent to one another, or separated by a portion of the surface of the substrate, which may be patterned or unpatterned. The methods may be carried out such that the first pattern is formed on the entire surface of the substrate, and then a second pattern is formed over a portion of the first pattern.

The methods described herein may be used to form a patterned substrate by exposing a substrate to differently dosed electron beams, and developing each differently exposed region using a different developer. The methods permit a template substrate to be patterned with different density patterns in different zones nearly simultaneously, without using alignment marks on the substrate surface. FIG. 2 is a flow diagram depicting a method for patterning the servo zones and bit zones on a template substrate using e-beam lithography and polystyrene-block-polymethylmethacrylate (PS-b-PMMA) BCP deposition.

In block 201, a substrate, or "wafer," is placed on an e-beam platform for e-beam exposure. One will appreciate that the substrate may be coated with an e-beam resist that will be exposed to the e-beam, such as PMMA, ZEP, and HSQ. If the substrate is a quartz substrate, such as shown in FIG. 2, then an additional layer of aluminum overlaying the resist may provide conductivity for the e-beam. If the substrate is a silicon substrate, then the overlying coating, such as an aluminum coating, may not be used. Before the resist is applied, a chemical affinity layer, such as a polystyrene or "PS" brush material may be applied to the substrate, by spin-coating onto the substrate, annealing, and then partially removing the brush material from the substrate surface to leave a thin PS brush layer 225 on the substrate surface. One having skill in the art will appreciate that a chemical affinity layer may promote the self-assembly of the BCP material. The PS brush layer 225 may be formed using a hydroxy terminated polystyrene, such as mono-hydroxyl-terminated polystyrene, hydroxy terminated poly(4-t-butyl styrene), diphenylmethylol terminated polystyrene, or the like. One of skill in the art will appreciate that other neutral polymers that promote BCP assembly may also be used.

In block 203 of FIG. 2, the substrate is exposed to an e-beam at two different doses. One dose of the e-beam is set at a higher dose than the other. The higher dose may be at least twice the strength of the lower dose. The higher dose may be used to pattern the servo zone, and the lower dose may be used to pattern the bit zone. The higher dose may precede or follow the lower dose, so long as each exposure is discrete and the substrate remains on the e-beam platform in between the two e-beam dosages. In this fashion, aligning or realigning the substrate on the e-beam pattern in between e-beam dosing may be avoided. Block 203 illustrates that the e-beam penetrates through the overlying Al layer (if present) down to the top surface of the PS brush layer (if present). One having ordinary skill in the art will appreciate that the e-beams do not penetrate or otherwise affect the underlying substrate layer.

In block 205 of FIG. 2, the substrate is developed using a first developer. The first developer will only develop the areas of resist exposed to the higher dose e-beam, i.e., the servo zone. As such, the first developer should be a weak developer rather than a strong developer, since a strong developer could wash away all of the patterns formed by the different e-beam exposures in both the servo zone and the bit zone. Before developing the substrate, any previously applied, overlying aluminum coating must be stripped to expose the resist to the developer.

In block 207 of FIG. 2, the partially developed substrate is descummed using $O_2$ plasma or other known techniques. One of ordinary skill in the art will appreciate that descumming will remove contaminants from the developing in block 205, as well as portions of the PS brush layer 225 at the bottom of the trenches (or "valleys") in the servo zone, as shown in block 207. A mask is then overlaid onto the partially developed areas of the template substrate. The mask may be chromium (Cr), tantalum (Ta), carbon (C), or another known hard mask material. The mask material is evaporated onto the partially developed template substrate to cover the portions of the template substrate exposed by the first developing.

One of ordinary skill in the art will appreciate that evaporation of Cr or other mask materials will result in a thin layer on the partially developed and descummed template substrate. The thin layer of hard mask material will also coat the peaks and valleys of the e-beam lithography pattern on the template substrate so that portions of the substrate where the resist material remains will have the resist material covered with a mask material. Removal of the mask layer from the peak portions of the patterned substrate may be achieved, for example, by using a high angle ion milling process with an inert gas, such as argon. The high angle enables selective removal of the mask layer from the resist, leaving the valley portions of the substrate material still covered with a layer of the mask material.

In block 211, the portion of the resist exposed to the lower dose e-beam in block 203 is developed using a second developer. The second developer fixes the pattern of the bit zone portion on the substrate by removing the resist exposed to the e-beam down through the PS brush layer 220, to the substrate material. The pattern in the servo zone is protected by the mask layer 212. This may be followed by descumming of the substrate using, e.g., $O_2$ plasma.

In block 213, substantially all of the e-beam resist is stripped from the substrate, and then a BCP film is spin-coated onto the stripped substrate with the exposed bit-area pattern on the substrate and the chromium-capped servo-area-pattern. In this example, the BCP is PS-b-PMMA, but one of ordinary skill in the art will appreciate that other BCPs may be used depending upon the pattern.

In block 215, the BCP on the substrate is thermally annealed to cause self assembly of the BCP into the pattern. As previously mentioned, self assembly of the BCP may be facilitated by the addition of a chemical affinity layer, such as PS brush layer 220, which may be spin-coated onto the substrate prior to the formation of the e-beam resist in block 201. The PS brush 225 may be a hydroxy terminated polystyrene or any neutral polymer that promotes BCP self assembly.

Returning to block 215, after annealing the BCP on the template substrate, the PMMA portion of the BCP may be removed by exposing the template substrate to UV light, then washing the substrate with acetic acid. Following removal of the PMMA portion down to the substrate surface, a thin layer of Cr, Ta, C or other hard mask material is evaporated onto the substrate, forming a thin mask layer on the remaining BCP portion and capping the portions of the substrate exposed by the removal of the PMMA block.

In block 217, the mask is removed from the surface of the remaining BCP. In an embodiment where the hard mask layer is a Cr layer, the mask is removed using a wet or dry lift-off process. Once the mask is removed, the remaining BCP is removed. This leaves portions of the substrate surface in the bit area and the servo area covered with the mask previously deposited in two separate evaporations: the mask in the bit area (218) and the mask in the servo area (218B), both of which cover the substrate surface. In block 219, the substrate is etched using reactive ion etching (RIE), inductively coupled plasma etching (ICP) or ion beam etching (IBE) techniques to form pillars 220 and 220B. One skilled in the art will appreciate that the remaining mask materials 218 and 218B will be removed during the etching process.

One will appreciate that the process illustrated in FIG. 2 and described herein may vary according to the uses of the template.

FIG. 3 is a flow diagram in which PS-b-PDMS (polystyrene-block-polydimethylsiloxane, is used as the BCP material. One or ordinary skill in the art will appreciate that the use of PS-b-PDMS, which is a spherical BCP material, may result in denser patterns than cylindrical BCP material, such as the PS-b-PMMA described above and illustrated in FIG. 2. The process prior to introduction of the PS-b-PDMS proceed similar to the process illustrated in blocks 201-211, except that during e-beam lithography, the bit zone will be patterned to complement the spherical structures inherent in PS-b-PDMS.

In block 313 of FIG. 3, the e-beam resist is stripped and PS-b-PDMS is coated onto the substrate with an optional PS brush layer between the substrate surface and the e-beam resist. For example, PS-b-PDMS BCP may be spin-coated onto the substrate at 3000 rpm, and the PS-b-PDMS may have a molecular weight of 17.5 kg/mol with a PDMS volume fraction of about 0.29.

In block 315, the deposited BCP material is annealed. Annealing may be performed by applying heat and vacuum (e.g., at a temperature of 160° C. in a vacuum oven for 24-48 hours), followed by a fluorine-based RIE process may be used to remove any residual or extra PDMS remaining on the surface following the annealing.

In block 317, the PS portion of the BCP is removed. One having ordinary skill in the art will appreciate that this may be done by applying oxygen-based RIE, thereby partially exposing some of the PDMS spheres. In the data zone, the PS-b-PDMS spheres may be used as an etch mask, whereas in the servo zone, the Cr layer may be used as an etch mask. In other words, unlike the method illustrated in FIG. 2 and described above with reference to PS-b-PMMA, an additional Cr evaporation after annealing is not required in the method shown in FIG. 3, since the PS-b-PDMS may act as an etch mask for the data zone.

In block 319 of FIG. 3, a fluorine-based RIE was applied to etch PDMS patterns and Cr patterns into the substrate, thereby resulting in a template. Other methods of etching may also be employed without departing from the scope of this disclosure.

The BCP that is used in the methods may be comprised of at least two constituent units, structural units, or "blocks," herein termed "block A" and "block B." Use of the singular "block A" or "block B" also includes use of plural "blocks A" and "blocks B." Block A and block B may be organic or inorganic, or block A may be organic, and block B inorganic, or block A may be inorganic and block B organic. Block A and block B may be immiscible. The block copolymer formed by block A and block B may be named using the convention polyA-block-polyB.

The block copolymers used in the methods may be selected from polystyrene-block-polymethylmethacrylate (PS-b-PMMA), polystyrene-block-poly2-vinylpyridine, polystyrene-block-poly4-vinylpyridine, polystyrene-block-polyethyleneoxide, polystyrene-block-polyisoprene, polystyrene-block-butadiene, polystyrene-block-polydimethylsiloxane (PS-b-PDMS), polyisoprene-block-polydimethylsiloxane, polymethylmethacrylate-block-polydimethylsiloxane, polyisobutylene-block-polydimethylsiloxane, or polystyrene-block-polyferrocenylsilane. A person of ordinary skill in the art will appreciate that the methods described herein may be varied depending upon the chemical characteristics of the BCP selected. One will appreciate that selection of the BCP may also depend upon the target pattern to be created using the BCP. For example, the topographical pattern left by the imprinting described below may determine the chosen BCP, since certain BCP blocks may correlate better with certain topographical pattern features and pattern dimensions.

Figure 8:
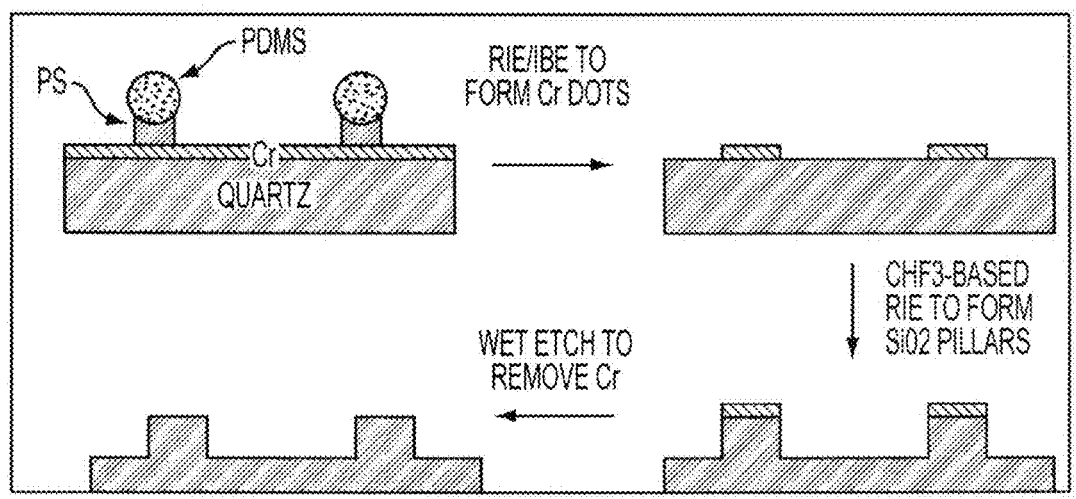
FIG. 8 is a flow diagram depicting a process for integrating block copolymer self-assembly methods into a mask etch process according to an embodiment.

One advantage of using siloxane-based block copolymers is that the siloxane blocks (minority component) are transformed into $SiO_x$ spheres upon exposure to oxygen plasma, unlike PS-b-PMMA with two organic components. $SiO_x$ has good dry etch resistance, and may be used as the mask for pattern transfer onto various mask materials. Further, when a chemical affinity layer is provided, the aspect ratio of block copolymer nanodots may be adjusted by utilizing chemical affinity layers with different thicknesses. As shown in FIG. 8, low aspect-ratio block copolymer nanodots may be used to RIE a thin hard mask layer and then nanoimprint a mold material, such as quartz. High aspect-ratio block copolymer dots may also be used to RIE a thick hard mask layer and then RIE or ion mill onto a magnetic material.

One will appreciate that the above described processes are examples of how e-beam lithography and BCP self-assembly techniques may be incorporated into the template fabrication process to achieve densities greater than 1 Tdpsi. By varying the techniques described herein, even more dense patterns may be formed. As shown, positive-tone e-beam lithography may be combined with a Cr lift-off process to achieve a bit density of 500 Gdpsi-1 Tdpsi. To achieve bit densities between 1-1.5 Tdpsi, positive-tone/Cr lift-off e-beam lithography techniques may be integrated with PS-b-PMMA block copolymer self-assembly techniques as described herein. To achieve bit densities between 1.5-5 Tdpsi, positive tone/Cr etch e-beam lithography techniques may be combined with PS-b-PDMS block copolymer self-assembly techniques as described herein. To achieve bit densities of 5-8 Tdpsi, e-beam lithography may be integrated with other functional block copolymer self-assembly techniques processes. Similarly, to achieve bit densities of 8-10 Tdpsi, e-beam lithography techniques may be combined with self-assembling magnetic nanoparticle processes. As such, the technique of combining e-beam lithography techniques with other nanoimprint lithography techniques may yield greater bit densities of up to 10 Tdpsi and beyond.

The domain spacing that may be achieved using the block copolymer systems and methods described herein depends on several factors: (1) the polymer type (polyA-block-polyB) and composition (volume fraction of A); (2) degree of polymerization (N); and (3) degree of immiscibility, also known as the interaction parameter ($\chi$). For certain kinds of block copolymers, the composition determines the domain arrangement, i.e., lamellae, cylinders, or spheres. The block copolymer morphologies in thin films that are most useful in the methods include perpendicularly-oriented cylinders and monolayered spheres.

In principle, the domain spacing of a block copolymer is proportional to N and $\chi$. To obtain a small domain spacing, the degree of polymerization (N) may be decreased. The interaction parameter ($\chi$) may be increased, and it is mainly determined by the block components selected for the block copolymer, and has a weak temperature dependence. According to mean-field theory, the value of $\chi N$ should be larger than 10.5 in order to maintain an ordered structure, which sets the limit of domain spacing for block copolymers. To decrease the value of N, blocks that result in a higher $\chi$ value are selected to form the block copolymer. In the methods, siloxane-based block copolymers have been found to have relatively large $\chi$ values, thereby enabling the formation of ordered domain structures with spacings of 25 nm or less.

One drawback of block copolymer self-assembly is that the self-assembled structures may lack long-range order. The methods for making BPM templates also include methods for providing improved long-range order of block copolymer domains. The method, called chemistry-driven self-alignment, employs both a topographic substrate pattern and a chemical affinity layer, such as a PS brush layer. The topographic pattern, consisting of alternatively trenches and lines, provides rough guidance to cause all block copolymer domains to fall within the trench. And the chemical affinity layer, which may attract the majority component in the block copolymer, is used to help promote the fine alignment of the block copolymer domains.

Figure 4:
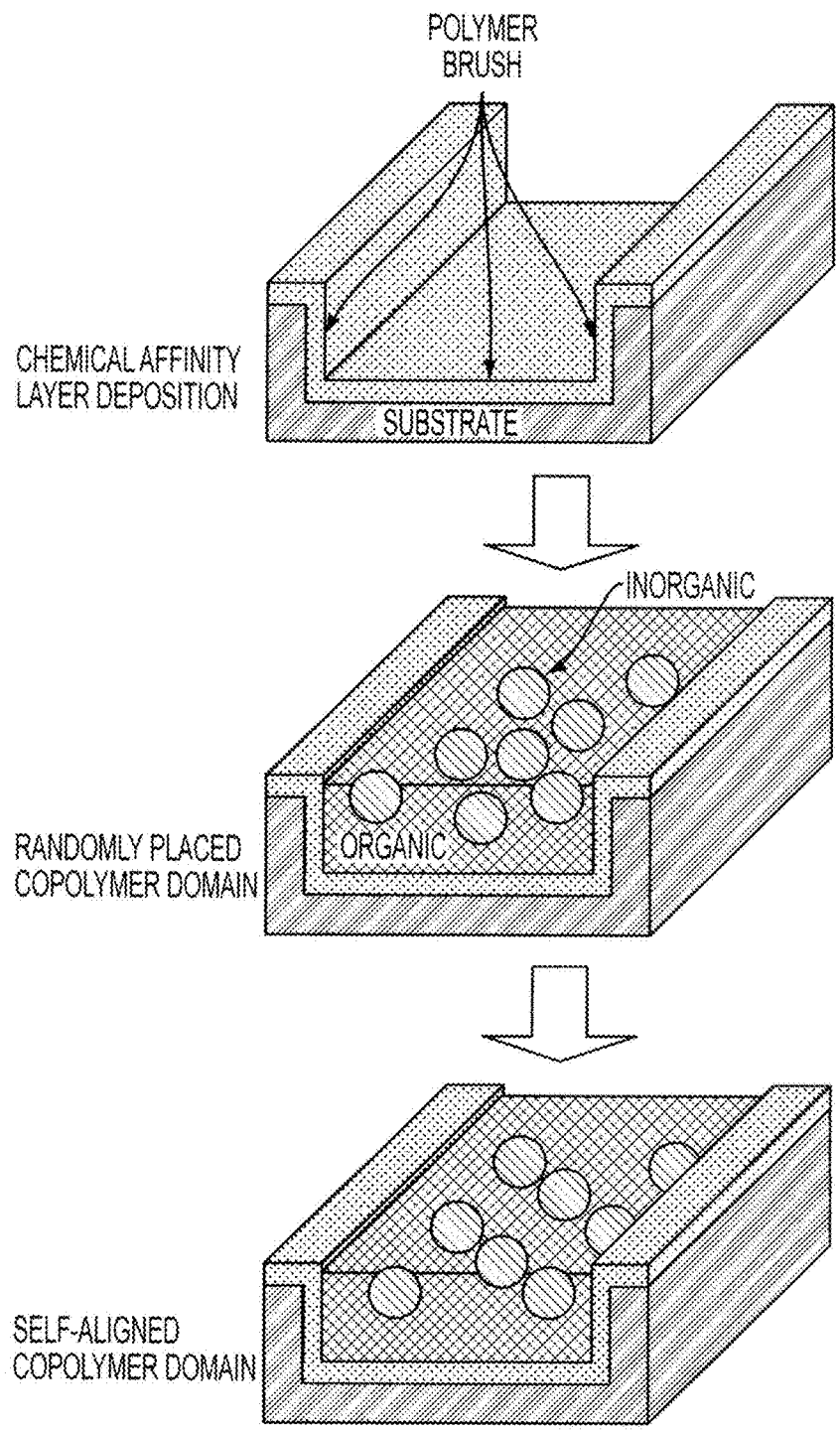
FIG. 4 is a flow diagram illustrating a chemistry-driven self-alignment process according to an embodiment.

As illustrated in FIG. 4, after the creation of topographically patterned substrates, a 5-30 nm thick chemical affinity layer, comprising a polymer brush having affinity for the majority organic block in the copolymer, is deposited on the surfaces of trench bottom and sidewalls. Then a sphere-forming block copolymer thin film is spin-coated into the trench. Because the as-spun film in the trench is far from its thermodynamic equilibrium status, block copolymer domains separate randomly in the trench without apparent long-range order. After conducting thermal or solvent annealing, the majority of the blocks adhere to the chemical affinity layer on both the trench bottom and the sidewall. As a result, the minority spherical domains form a well-ordered array in the trench. The film thickness in the trench may be designed to be on the order of one domain spacing, in order to deliver a monolayer structure.

Figure 5A:
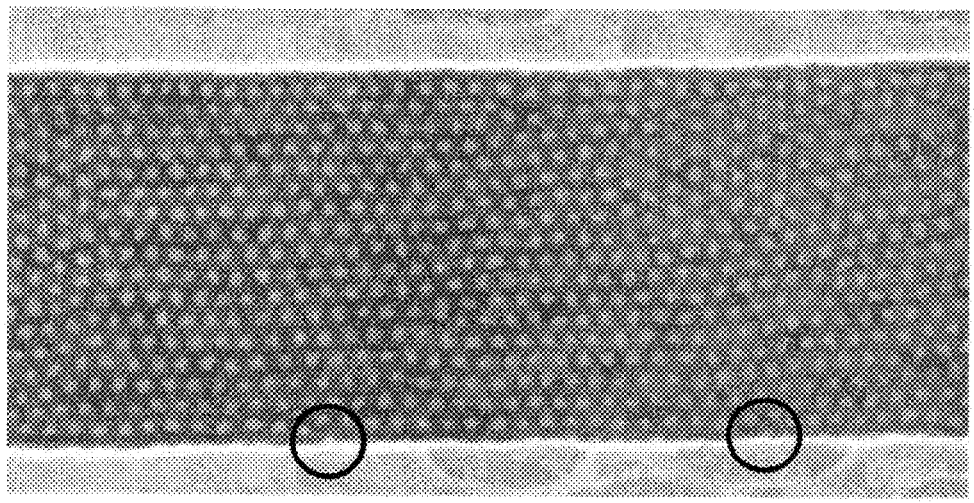
FIG. 5 shows two examples of block copolymer domain structures ordered on two different kinds of patterned substrates.
Figure 5B:
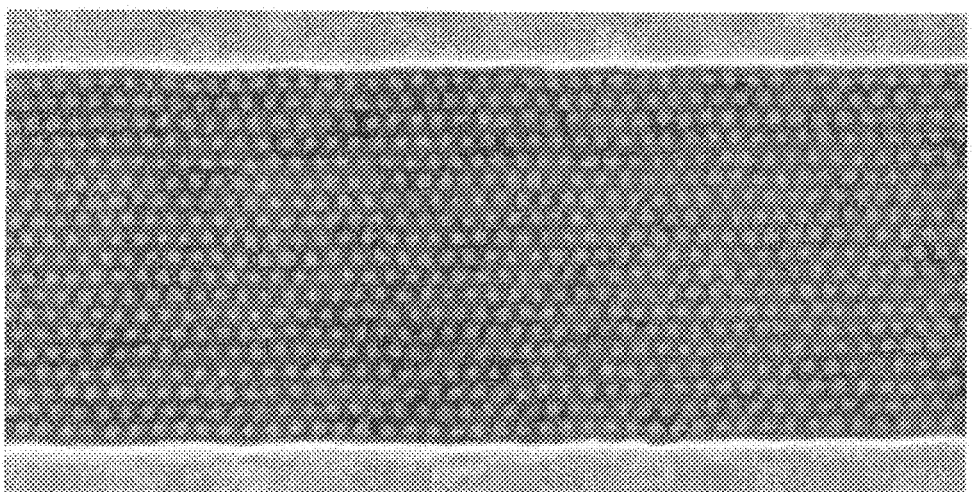

FIG. 5 shows two examples of block copolymer domain structures ordered on two different kinds of patterned substrates. In a trench 110 without surface pretreatment, due to the lack of preferential wetting of copolymer blocks to the trench sidewall 115, the minority blocks, spheres or half-spheres 120, may reside on the sidewall 115, which breaks the pattern of the hexagonally-arranged spherical domains. In comparison, the pattern of the block copolymer dot array in the pretreated trench showed improved long-range order.

Figure 6:
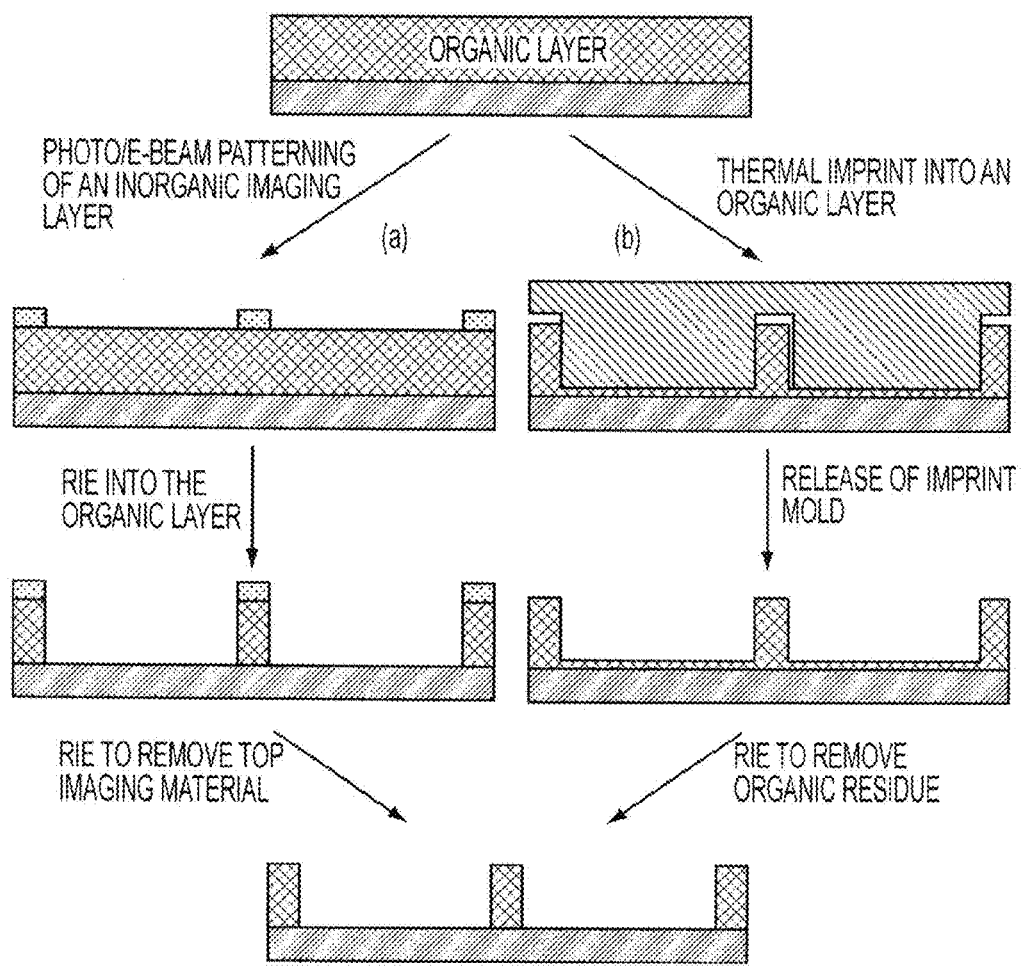
FIG. 6 is a flow diagram illustrating methods for forming an organic resist pattern for chemistry-driven self alignment using (a) a photo/e-beam patterning approach or (b) an imprinting approach according to an embodiment.

It should be noted that the chemical affinity techniques may be accomplished not only through the deposition of the polymer brush 225 onto a patterned substrate, but also via the formation of a soft patterned substrate 202. FIG. 6 shows two approaches for preparing a polymeric topographic pattern. The organic layer 230 consists of a polymer the same as or very similar to the organic component (majority block) of the copolymer. An inorganic resist pattern 240 is formed on top of the organic layer, which will then be used as an etch mask for performing RIE on the organic layer 230. A thermal imprint process is then used to create a topographic pattern in the organic layer 230. One advantage of the soft substrate pattern is that it may be removed easily by oxygen plasma during etching of the organic block in the copolymer.

As shown in FIGS. 7(a) and (b), pattern transfer schemes may be used for (a) fabrication of an imprint mold using low aspect ratio block copolymer domain structures and (b) fabrication of magnetic dots using high aspect ratio block copolymer domain structures.

As shown in FIG. 8, the block copolymer self-alignment process may be integrated into a pillar-tone resist process, such as an HSQ/Cr etching process. In such methods, PS-b-PDMS may be the block copolymer.

Figure 9:
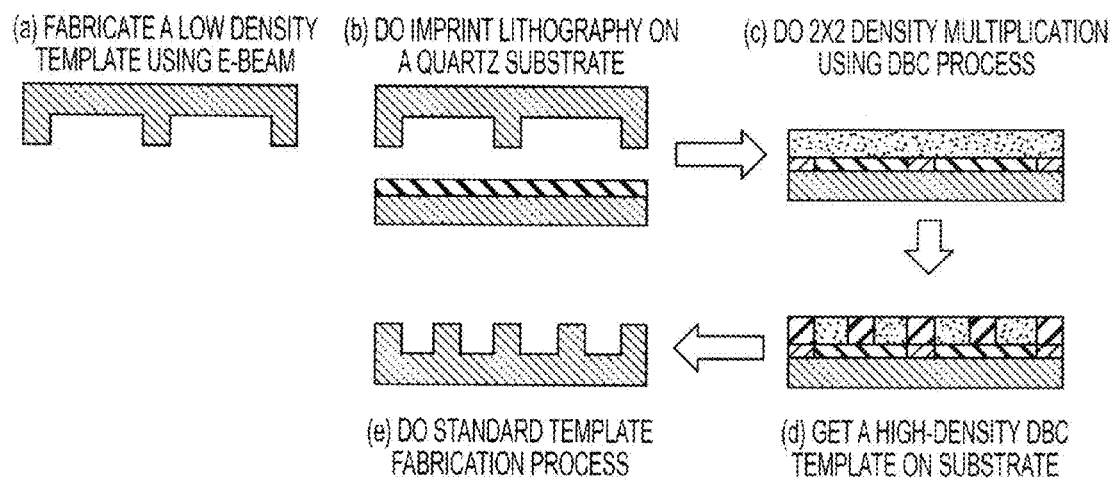
FIG. 9 is a flow diagram depicting a process for enhancing resolution of a low density template using 2×2 density multiplication according to an embodiment.

As shown in FIG. 9, the block copolymer self-alignment may also be used to make high-density imprint templates by combining imprint lithography with DBC process. The imprint lithography is used to produce low-density resist patterns as guided pre-patterns for BCP assembly. BCP material will increase pattern density by a factor of at least 4 (2×2 for example). The DBC 2×2 process includes (1) fabricating a low-density quartz template using an e-beam process, (2) performing imprint lithography on a quartz substrate that will be used to fabricate a high-density template; (3) carrying out a 2×2 density multiplication process using DBC; and (4) using a high-density DBC polymer template to fabricate a high-density quartz template.

Figure 10:
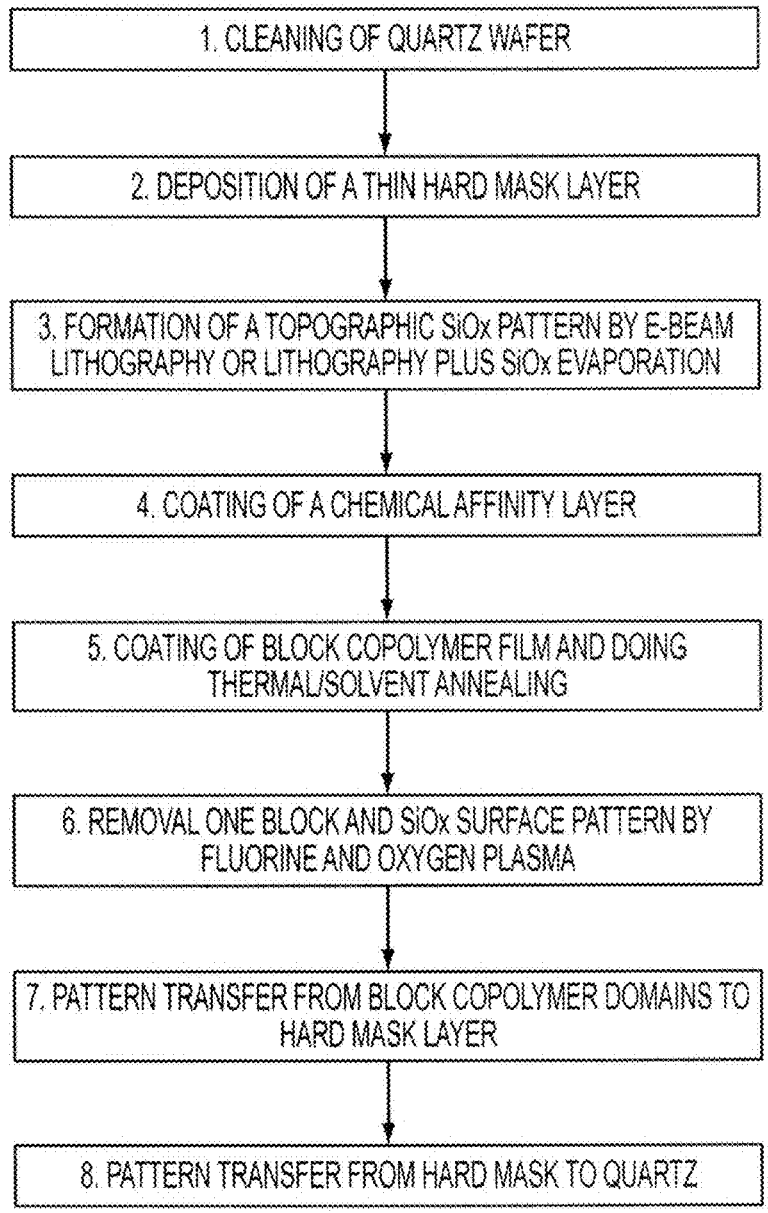
FIG. 10 depicts a process for methods of fabricating a quartz-based UV NIL mold according to an embodiment.

The block copolymer self-alignment process may also be integrated into a nanoimprinting lithography (NIL) mold fabrication process. FIG. 10 illustrates an overall process flow for integrating the generation of BPM resist template using block copolymers into the fabrication of a UV NIL mold based on quartz. The method includes (1) cleaning a quartz wafer; (2) depositing a thin, hard mask layer on the quartz layer; (3) forming a topographic $SiO_x$ pattern by e-beam lithography or lithography plus $SiO_x$ evaporation; (4) coating the $SiO_x$ pattern with a chemical affinity layer; (5) coating the chemical affinity layer with the block copolymer film, and conducting thermal/solvent annealing; (6) removing one block and $SiO_x$ surface pattern by fluorine and oxygen plasma; (7) transferring the pattern from the block copolymer domains to a hard mask layer; and (8) transferring the pattern from the hard mask to quartz.

The methods described herein are not limited to BPM-related applications. In principle, they may be used for many other applications with high-resolution templates having a periodic dot pattern, including, but not limited to, CMOS, flash memory, and the like.

These and other aspects of the invention are further described in the non-limiting Examples set forth below.

EXAMPLES

Example 1

A 6-inch silicon wafer was cleaned using $O_2$ plasma etching, with the RF power set at 480 W, a pressure of 4,250 mtorr, at a temperature of 100° C. for four minutes, thirty seconds (4.5 min). A polystyrene brush was deposited on the cleaned wafer by spin coating a 1% toluene solution of mono-hydroxyl-terminated polystyrene (PS-OH, Mn 3,700 g/mol) at 3,000 rpm. The wafer was then annealed at 150-180° C. for 6-8 hours under vacuum. The wafer was soaked in toluene 15 minutes, and rinsed with isopropanol (IPA), then blown dry with nitrogen ($N_2$) gas. The wafer was then coated with a ZEP520 resist or PMMA e-beam resist at 3,000 rpm and baked at 180° C. for 5-10 minutes. Although this was not done in the present experiment because the substrate was silicon, one will appreciate that if the wafer was quartz, an additional 5-15 nm of Al may be layered on top of the e-beam resist using ion beam deposition (IBD).

The wafer with the e-beam resist layer was then exposed to an electron beam to transfer a pattern in to the e-beam resist layer, first at a low dose, then to transfer a second pattern into the e-beam resist layer corresponding to the servo zone using a dose at least two times higher than the low dose. The area exposed to the low dose e-beam corresponds to the area where the bit zone should be on the finished master template, and the area exposed to the higher dose e-beam corresponds to where the servo zone should be on the finished master template. The area exposed to the higher dose e-beam (servo zone) was then developed using a first developer. For example, when ZEP520 was used as the resist, IPA was used as the first developer. In an example where the wafer is a quartz substrate overlaid with resist and an Al coat, the Al must first be removed using AZ 400K Developer diluted 1:4. The wafer was exposed to the 400K Developer for around 1 minute, then washed with deionized (DI) water. This developing removed the e-beam resist down to the template substrate surface according to the transferred pattern for the servo zone. The e-beam resist associated with the bit zone remained intact.

The partially developed wafer was then descummed with $O_2$ plasma for 1-2 minutes, then a thin layer of Cr was evaporated as a 5-10 nm-thick hard mask layer. The hard mask layer covered the top surface of the e-beam resist associated with the bit zone and covered the top surface of the e-beam resist in the servo zone that remained after developing. The hard mask layer also capped the template substrate surface exposed during development of the paper formed on the servo zone. This hard mask layer protects the exposed surface of the template substrate materials against subsequent processing. Therefore at conclusion of hard mask application, the hard mask layer covers the upper surface of the e-beam mask in the bit zone, the upper surface of the e-beam resist in the servo zone and the exposed template substrate.

The Cr was removed from the peak portions of the patterned wafer using high angle Ar ion milling at 70° C. for 20-40 seconds. In this example, the Ar had a flow rate of 14 sccm, 625V at 900 mA. After removing Cr from the peak portions of the patterned wafer, the patterned wafer was developed in a second developer. In this example, ZED N50 was used, which one of ordinary skill in the art will appreciate is weaker than the IPA used as the first developer. The wafer was then descummed with $O_2$ plasma for 1-2 minutes to remove any remaining developer.

After descumming the patterned and developed wafer, the e-beam resist was stripped from both the bit zone and the servo zone by soaking the wafer in EBR solvent for 1.5 hours, and ultrasonicated for 30 minutes as 40 kHz. The wafer was then rinsed with EBR and dried with $N_2$ gas. A 1% toluene solution containing PS-b-PMMA BCP was spin-coated onto the wafer at 2000-3000 rpm. The wafer was annealed at a 160-180° C. for 12-24 hours under vacuum. To remove the PMMA blocks, the wafer was exposed to deep UV light for 10 minutes and then soaked in acetic acid for another minute, rinsed with DI water and blown dry with $N_2$ gas. One having ordinary skill in the art will appreciate that PS-b-PMMA was chosen as the BCP because its blocks fit the bit zone pattern previously formed by e-beam lithography. The BCP will not effectively pattern the servo zone area of the wafer. One will also appreciate that the BCP pattern may be density multiplied in order to increase areal density.

A thin layer of Cr was evaporated onto the patterned wafer as a hard mask layer having a thickness of 5-10 nm on the template substrate surface exposed in the bit zone and on the remaining BCP surface. The hard mask layer was then removed from the surface of the remaining BCP using Cr lift-off techniques. Either wet or dry Cr lift-off techniques may be used. The wafer was then exposed to RIE or IBE using 9 sccm of $CHF_3$ and 1 sccm of $O_2$ for 35 seconds at 300V and 500 mA to remove the remaining BCP. The pattern, including the patterns for the servo and bit zones, was transferred from the Cr hard marks into the wafer substrate. Any remaining Cr residue was then removed using a wet lift-off process.

The various aspects presented throughout this disclosure are provided to enable one of ordinary skill in the art to practice the present invention. Various changes, alterations, modifications to the compounds and apparatus presented throughout this disclosure will be readily apparent to those skilled in the art, and the concepts disclosed herein may be extended to other compounds and apparatus. Thus, the claims are not intended to be limited to the various aspects of this disclosure, but are to be accorded the full scope consistent with the language of the claims. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method comprising:
   conducting e-beam lithography to form a servo pattern on a substrate; and
   conducting a differently dosed e-beam lithography and block-copolymer assembly to form a bit pattern on said substrate.

2. The method of claim 1, wherein the lithography comprises:
   depositing a mask layer on the substrate; and
   forming said servo pattern on the substrate.

3. The method of claim 2, wherein the lithography further comprises applying a chemical affinity layer to the patterned substrate.

4. The method of claim 1, wherein the block-copolymer-assembly comprises:
   coating the substrate with a block copolymer;
   removing one block from the block copolymer; and
   transferring the pattern from the remaining block of the block copolymer to the substrate.

5. The method of claim 4, wherein a polymeric brush layer is provided under the coating of block copolymer.

6. The method of claim 5 wherein the polymeric brush layer consists of a polymer selected from the group consisting of hydroxy terminated polystyrene, mono-hydroxyl-terminated polystyrene, hydroxy terminated poly(4-t-butyl styrene) and diphenylmethyl-ol terminated polystyrene.

7. The method of claim 4 wherein the block copolymer is selected from the group consisting of polystyrene-block-polymethylmethacrylate, polystyrene-block-poly2-vinylpyridine, polystyrene-block-poly4-vinylpyridine, polystyrene-block-polyethyleneoxide, polystyrene-block-polyisoprene, polystyrene-block-butadiene, polystyrene-block-polydimethylsiloxane, polyisoprene-block-polydimethylsiloxane, polyisobutylene-block-polydimethylsiloxane, polymethylmethacrylate-block-polydimethylsiloxane, and polystyrene-block-polyferrocenylsilane.

8. The method of claim 1, wherein the servo pattern is formed on a portion of the surface of the substrate.

9. The method of claim 1, wherein the bit pattern is formed on a portion of the surface of the substrate adjacent to said servo pattern.

10. The method of claim 1, wherein the servo pattern is formed on the entire surface of the substrate.

11. The method of claim 1, wherein the bit pattern is formed over a portion of the servo pattern.

12. The method of claim 1, wherein the substrate comprises silicon.

* * * * *